(12) United States Patent
Zhu

(10) Patent No.: US 11,005,057 B2
(45) Date of Patent: May 11, 2021

(54) ORGANIC LIGHT EMITTING DIODE FOLDING DISPLAY PANEL AND MANUFACTURING METHOD THEREOF

(71) Applicant: Wuhan China Star Optoelectronics Semiconductor Display Technology Co., Ltd., Hubei (CN)

(72) Inventor: Chao Zhu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/627,218

(22) PCT Filed: Oct. 28, 2019

(86) PCT No.: PCT/CN2019/113766
§ 371 (c)(1),
(2) Date: Dec. 27, 2019

(65) Prior Publication Data
US 2021/0091317 A1 Mar. 25, 2021

(30) Foreign Application Priority Data

Sep. 25, 2019 (CN) .......................... 201910908738.0

(51) Int. Cl.
*H01L 51/00* (2006.01)
*G09F 9/30* (2006.01)
(Continued)

(52) U.S. Cl.
CPC .......... *H01L 51/0097* (2013.01); *G09F 9/301* (2013.01); *H01L 27/323* (2013.01);
(Continued)

(58) Field of Classification Search
None
See application file for complete search history.

(56) References Cited

U.S. PATENT DOCUMENTS 10,303,312 B2 * 5/2019 Yu .......................... G06F 3/0446
2018/0032189 A1 2/2018 Lee et al.
(Continued)

FOREIGN PATENT DOCUMENTS

CN 204143398 U 2/2015
CN 106328003 A 1/2017
(Continued)

*Primary Examiner* — J. E. Schoenholtz
(74) *Attorney, Agent, or Firm* — Hamre, Schumann, Mueller & Larson, P.C.

(57) ABSTRACT

An organic light emitting diode (OLED) folding display panel and a manufacturing method thereof include: a folding region and a non-folding region. The folding region includes a flexible substrate, an OLED device layer, a thin film encapsulation layer, a first touch structure layer, a polarizer, and a flexible cover plate. The non-folding region includes a flexible substrate, an organic light emitting diode device layer, a thin film encapsulation layer, a second touch structure layer, a polarizer, and a flexible cover plate. The first touch structure layer and the second touch structure layer are disposed in the same layer but have different material and structures.

20 Claims, 6 Drawing Sheets

(51) Int. Cl.
*H01L 27/32* (2006.01)
*H01L 51/52* (2006.01)
*H01L 51/56* (2006.01)

(52) U.S. Cl.
CPC ...... *H01L 51/5253* (2013.01); *H01L 51/5281* (2013.01); *H01L 51/56* (2013.01); *H01L 2251/306* (2013.01); *H01L 2251/308* (2013.01)

(56) References Cited

U.S. PATENT DOCUMENTS

| | | | |
|---|---|---|---|
| 2019/0064960 A1* | 2/2019 | Na | H01L 27/323 |
| 2019/0393278 A1* | 12/2019 | Wu | H01L 27/3244 |
| 2020/0058710 A1 | 2/2020 | Li | |
| 2020/0125202 A1 | 4/2020 | Li et al. | |
| 2020/0152710 A1 | 5/2020 | An et al. | |
| 2020/0241676 A1 | 7/2020 | Wang | |
| 2020/0379595 A1* | 12/2020 | Kim | G06F 1/1652 |

FOREIGN PATENT DOCUMENTS

| | | |
|---|---|---|
| CN | 206594962 U | 10/2017 |
| CN | 107479753 A | 12/2017 |
| CN | 107665908 A | 2/2018 |
| CN | 107665911 A | 2/2018 |
| CN | 108700972 A | 10/2018 |
| CN | 109062442 A | 12/2018 |
| CN | 109546009 A | 3/2019 |
| CN | 109860251 A | 6/2019 |
| CN | 110208975 A | 9/2019 |
| CN | 209418505 U | 9/2019 |
| CN | 209980671 U | 1/2020 |
| KR | 20180000039 A | 1/2018 |

\* cited by examiner

ORGANIC LIGHT EMITTING DIODE FOLDING DISPLAY PANEL AND MANUFACTURING METHOD THEREOF

FIELD OF INVENTION

The present invention relates to a field of displays, especially to an organic light emitting diode (OLED) folding display panel and a manufacturing method thereof.

BACKGROUND OF INVENTION

With the fast development of the display technologies, active-matrix organic light emitting diode (AMOLED) flexible displays have people's great concerns. Large dimension full screen phones, flexible and folding phones, and curved panel phones with AMOLED flexible displays will be applied extensively to the further market. The flexible display technologies can change a shape of a display device, which increases flexibility and diversity of display and therefore is expected to bring great evolution for the field of display technologies. However, to achieve a curved or folded flexible display panel, material of the module must be changed, and the touch system is the part changed greater.

A conventional touch panel employs indium tin oxide (ITO) as a main conductive material, but however the folding characteristic thereof is poor and easily causes broken wires during dynamically folding to influence touch performance. The Youm on-cell touch AMOLED (Y-OCTA) technology of the Samsung Electronics Co., Ltd employs a metal mesh to replace the ITO to be applied in the flexible touch display technology, which solves the issue of wires broken during touch display. However, the metal thereof has a poor light transmittance, wires are required to be arranged among pixels for increasing the light transmittance, which is difficult and raises the cost thereof.

Therefore, in the conventional OLED folding display panel has an issue that the touch structure layer of the OLED folding display panel employs ITO with poor flexibility and easily broken wires, or has an issue that although a metal mesh replacing ITO can solve the issue of broken wires, a manufacture process thereof is difficult and has a high cost. Solving the above issues is urgent.

SUMMARY OF INVENTION

Technical Issue

The present invention relates to an organic light emitting diode (OLED) folding display panel and a manufacturing method thereof that are configured for solving the issue that the touch structure layer of the OLED folding display panel employs ITO with poor flexibility and easily broken wires, or for solving the issue that although a metal mesh replacing ITO can solve the issue of broken wires, a manufacture process thereof is difficult and has a high cost.

Technical Solution

The solve the above issue, the present invention provides technical solutions as follows.

The present invention provides an organic light emitting diode (OLED) folding display panel comprising: a folding region and a non-folding region; wherein the folding region comprises a flexible substrate, an OLED device layer, a thin film encapsulation layer, a first touch structure layer, a polarizer, and a flexible cover plate;

the non-folding region comprises a flexible substrate, an OLED device layer, a thin film encapsulation layer, a second touch structure layer, polarizer, and a flexible cover plate; and the first touch structure layer and the second touch structure layer are disposed in a same layer, and material and a structure of the first touch structure layer is distinguished from material and a structure of the second touch structure layer.

According to an embodiment provided by the present invention, the flexible substrate is disposed as a lowest layer of the OLED folding display panel;

the OLED device layer is disposed on a side of the flexible substrate;

the thin film encapsulation layer is disposed on a side of the OLED device layer away from the flexible substrate;

the first touch structure layer and the second touch structure layer are disposed on a side of the thin film encapsulation layer away from the flexible substrate;

the polarizer is disposed on a side of the first touch structure layer away from the thin film encapsulation layer and a side of the second touch structure layer away from the thin film encapsulation layer; and the flexible cover plate is disposed on a side of the polarizer away from the first touch structure layer and the second touch structure layer, and is disposed as an uppermost layer of the OLED folding display panel.

According to an embodiment provided by the present invention, the first touch structure layer is a folding region touch structure layer employing a metal mesh, and the second touch structure layer is a non-folding region touch structure layer employing indium tin oxide.

According to an embodiment provided by the present invention, each of the first touch structure layer and the second touch structure layer comprises a predetermined thickness.

According to an embodiment provided by the present invention, each of the predetermined thicknesses the first touch structure layer and the second touch structure layer is 50 nm.

According to an embodiment provided by the present invention, The OLED folding display panel as claimed in claim 5, wherein the metal mesh employs a sawtooth structure.

According to an embodiment provided by the present invention, an optical transparent adhesive is disposed between the thin film encapsulation layer and the first touch structure layer or is disposed between the thin film encapsulation layer and the second touch structure layer, and another optical transparent adhesive is disposed between the first touch structure layer and the polarizer or is disposed between the second touch structure layer and the polarizer.

The present invention also provides an organic light emitting diode (OLED) folding display panel manufacturing method, wherein the method comprises:

a step S10, providing a flexible substrate;

a step S20, depositing an OLED device layer on a side of the flexible substrate;

a step S30, depositing a thin film encapsulation layer on a side of the OLED device layer away from the flexible substrate;

a step S40, depositing a first inorganic insulation layer on a side of the thin film encapsulation layer away from the OLED device layer, and depositing a first layer of metal of titanium aluminum titanium and a first layer of indium tin oxide on the first insulation layer, wherein the first layer of indium tin oxide is connected to the first layer of metal of titanium aluminum titanium through a through hole;

a step S50, depositing a second inorganic insulation layer on a side of the first inorganic insulation layer away from the thin film encapsulation layer, and depositing a second layer of metal of titanium aluminum titanium and a second layer of indium tin oxide on the second inorganic insulation layer, wherein the second layer of indium tin oxide is connected to the second layer of metal of titanium aluminum titanium through a through hole to form the first touch structure layer and the second touch structure layer;

a step S60, depositing a passivation layer on a side of the first touch structure layer away from the thin film encapsulation layer and on a side of the second touch structure layer away from the thin film encapsulation layer;

a step S70, forming a polarizer on the side of the first touch structure layer away from the thin film encapsulation layer and on the side of the second touch structure layer away from the thin film encapsulation layer;

a step S80, forming a flexible cover plate on a side of the polarizer away from the first touch structure layer and the second touch structure layer.

According to an embodiment provided by the present invention, before the step S40, depositing a first optical transparent adhesive on a side of the thin film encapsulation layer away from the OLED device layer is performed; before the step S60, depositing a second optical transparent adhesive on a side of the first touch structure layer or the second touch structure layer away from the polarizer is performed.

According to an embodiment provided by the present invention, the first inorganic insulation layer or the second inorganic insulation layer is silicon nitride or silicon oxynitride, and the passivation layer is silicon nitride, silicon oxide or organic material.

Advantages

Compared to the prior art, advantages of the OLED folding display panel and the manufacturing method thereof provided by the present invention are as follows.

1. The OLED folding display panel and the manufacturing method thereof provided by the present invention, divide the folding display panel into a folding region and a non-folding region, the touch layer in the folding region employs a metal mesh made of alloy of titanium aluminum titanium, metal wires are kept among pixels, which increases folding performance of the OLED folding display panel.

2. Second, a touch layer employs a design of ITO wires in the non-folding region, which drastically lowers the difficulty of the process and the manufacturing cost.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the description of the present invention, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present invention and simplifying the description instead of indicating or implying that the referred device or element must have a specific orientation or position, must to be structured and operated with the specific orientation or position. Therefore, they should not be understood as limitations to the present invention. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present invention, a meaning of "a plurality of" is two or more, unless there is a clear and specific limitation otherwise.

The present invention provides an organic light emitting diode (OLED) folding display panel and a manufacturing method thereof, with reference to FIGS. 1 to 6.

Figure 1:
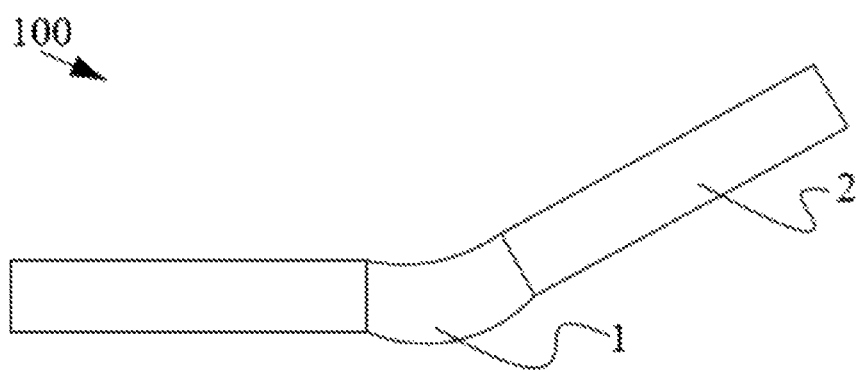
FIG. 1 is a first schematic structural view of an organic light emitting diode (OLED) folding display panel provided by an embodiment of the present invention.

With reference to FIG. 1, FIG. 1 is a first schematic structural view 100 of an organic light emitting diode (OLED) folding display panel provided by an embodiment of the present invention, i.e., an external structural view of the OLED folding display panel. The OLED folding display panel comprises: a folding region 1 and a non-folding region 2. The folding region 1 is defined among the non-folding region 3 and is configured to fold and display.

Figure 2:
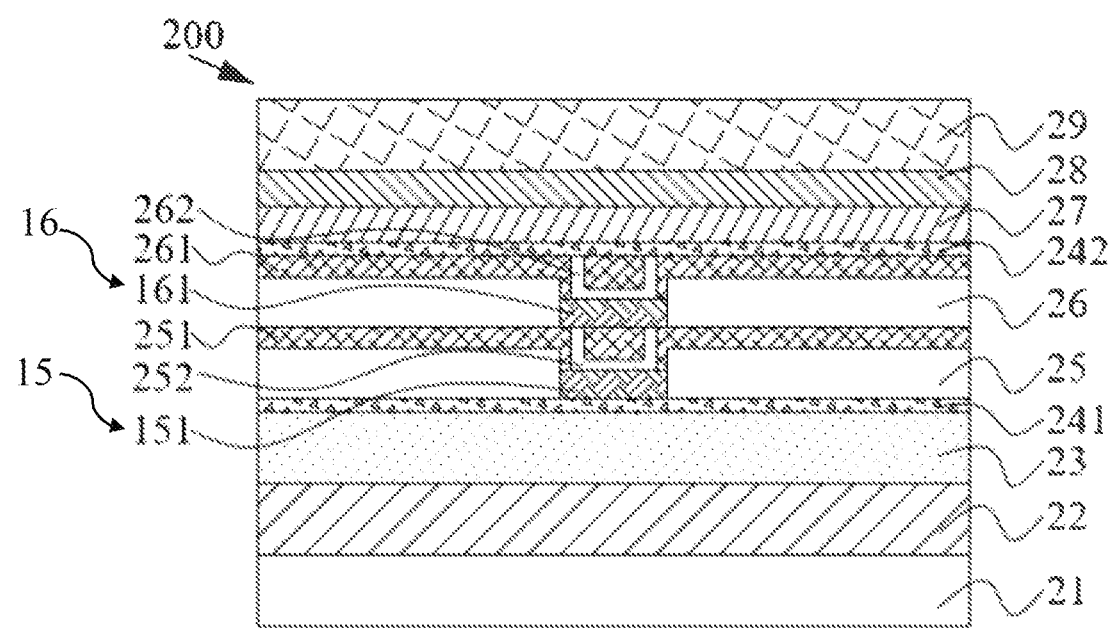
FIG. 2 is a second schematic structural view of the OLED folding display panel provided by an embodiment of the present invention.

With reference to FIG. 2, FIG. 2 is a second schematic structural view 200 of the OLED folding display panel provided by an embodiment of the present invention, i.e., an internal structural view of the OLED folding display panel. The folding region 1 comprises: a flexible substrate 21, an organic light emitting diode device layer 22, a thin film encapsulation layer 23, a first touch structure layer (15 and 16), a polarizer 28, and a flexible cover plate 29. The non-folding region 2 comprises: a flexible substrate 21, an organic light emitting diode device layer 22, a thin film encapsulation layer 23, a second touch structure layer (25 and 26), a polarizer 28, and a flexible cover plate 29. The first touch structure layer (15 and 16) and the second touch structure layer (25 and 26) are disposed in the same layer, but the first touch structure layer (15 and 16) is distinguished from the second touch structure layer (25 and 26).

As shown in the figures, the flexible substrate is disposed as a lowest layer of the entire OLED folding display panel. The organic light emitting diode device layer 22 is disposed on a side of the flexible substrate 21. The thin film encapsulation layer 23 is disposed on a side of the organic light emitting diode device layer 22 away from the flexible substrate 21. The first touch structure layer (15 and 16) and the second touch structure layer (25 and 26) are disposed on a side of the thin film encapsulation layer 23 away from the flexible substrate 21. The polarizer 28 is disposed on a side of the first touch structure layer (15 and 16) away from the thin film encapsulation layer 23 and on a side of the second touch structure layer (25 and 26) away from the thin film encapsulation layer 23. The flexible cover plate 29 is disposed on a side of the polarizer 28 away from the first touch structure layer (15 and 16) and the second touch structure layer (25 and 26), and is disposed as an uppermost layer of the entire OLED folding display panel.

In an embodiment of the present invention, the first touch structure layer (15 and 16) is a folding region touch structure layer, and employs a metal mesh. The second touch structure layer (25 and 26) is a non-folding region touch structure layer, and employs indium tin oxide. The second touch structure layer (25 and 26) is made by depositing an inorganic insulation layer 25, then depositing a first layer of ITO 251 on the first layer of inorganic insulation layer, then depositing a second layer of inorganic insulation layer 26, and then depositing a second layer of ITO 261 on the second layer of inorganic insulation layer 26. The first touch structure layer (15 and 16) is made by depositing an inorganic insulation layer 25, and then depositing a first layer of metal mesh 151 on the first layer of inorganic insulation layer 25, and the metal mesh is alloy of titanium aluminum titanium, then depositing a second layer of inorganic insulation layer 16, and then depositing a second layer of metal mesh 161 on the second layer of inorganic insulation layer 16. The first layer of ITO 251 is connected to the first layer of metal mesh 151 through a first through hole 252. The second layer of ITO 261 is connected to the second layer of metal mesh 161 through a second through hole 262.

In an embodiment of the present invention, each of the first touch structure layer (15 and 16) and the second touch structure layer (25 and 26) comprises a certain predetermined thickness, and the predetermined thickness of each of the first touch structure layer (15 and 16) and the second touch structure layer (25 and 26) is 50 nm.

In an embodiment of the present invention, an optical transparent adhesive is disposed between the thin film encapsulation layer 23 and the first touch structure layer (15 and 16) or the second touch structure layer (25 and 26), and an optical transparent adhesive is disposed between the first touch structure layer (15 and 16) or the second touch structure layer (25 and 26) and the polarizer 28 (the first optical transparent adhesive 241 and the second optical transparent adhesive 242). The optical transparent adhesive (241 and 242) also has a certain predetermined thickness, and the predetermined thickness of the optical transparent adhesive (241 and 242) is 1 um.

In an embodiment of the present invention, a passivation layer 27 is disposed between the second optical transparent adhesive 242 and the polarizer 28.

Figure 3:
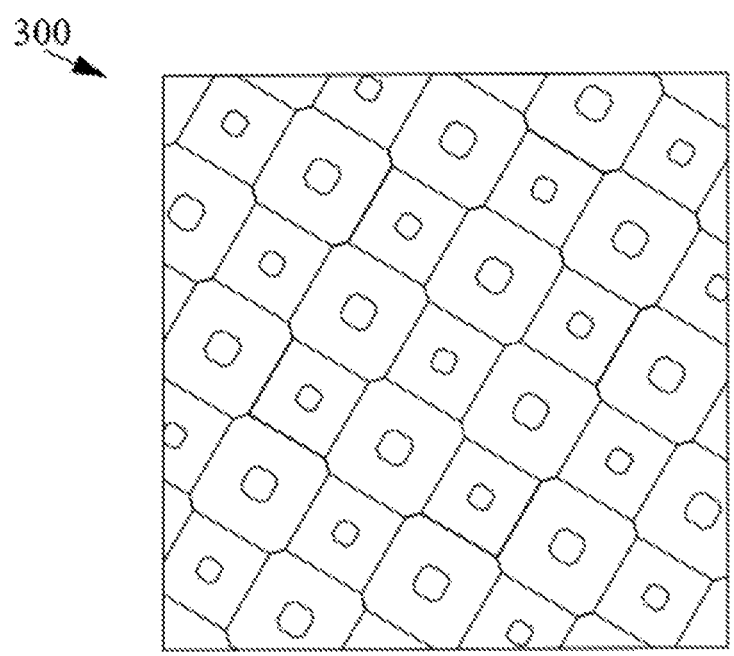
FIG. 3 is a schematic structural view of a first touch structure layer of the OLED folding display panel provided by an embodiment of the present invention.
Figure 4:
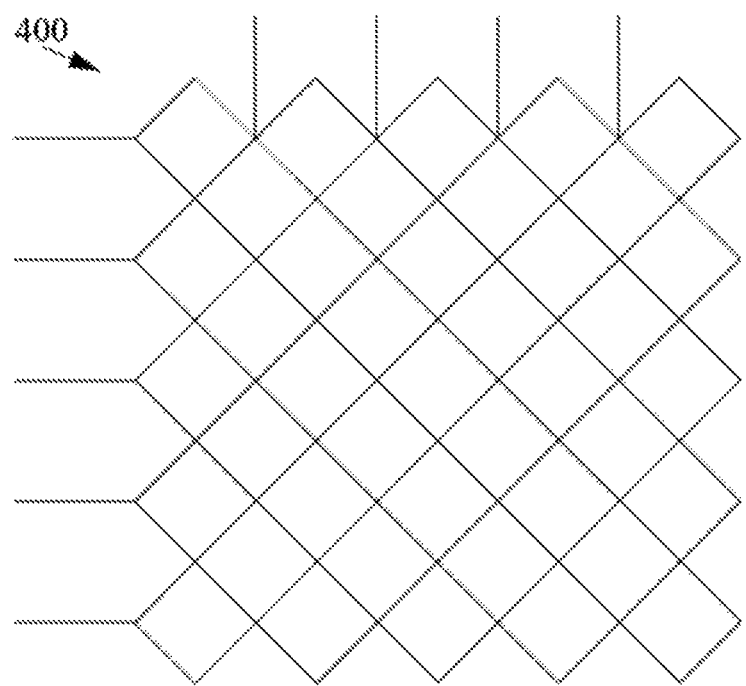
FIG. 4 is a schematic structural view of a second touch structure layer of the OLED folding display panel provided by an embodiment of the present invention.

With reference to FIGS. 3 and 4, FIG. 3 is a schematic structural view of a first touch structure layer of the OLED folding display panel provided by an embodiment of the present invention, and FIG. 4 is a schematic structural view of a second touch structure layer of the OLED folding display panel provided by an embodiment of the present invention. Red, green, and blue (RGB) pixels are preferably designed in a rhombus structure, but is not limited to the rhombus structure, and can also be other structure.

Figure 5:
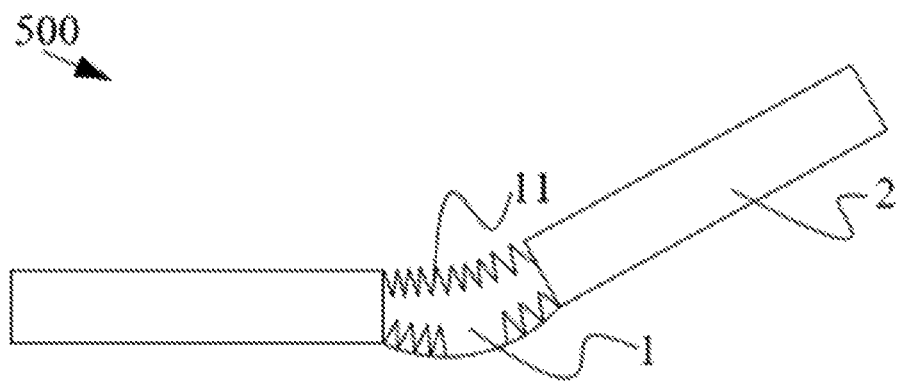
FIG. 5 is a third schematic structural view of the OLED folding display panel provided by an embodiment of the present invention.

With reference to FIG. 5, FIG. 5 is a third schematic structural view 500 of the OLED folding display panel provided by an embodiment of the present invention. To further enhance resistance against broken wires in the folding region, 在 the folding region has an added sawtooth structure while employing the metal mesh. Because the added sawtooth structure, a curvature of the bended folding region is increased, which reduces occurrence of concentrated stress, also lower a risk of rupture of the folding wires, and ensures a yield rate of the OLED folding display panel.

Figure 6:
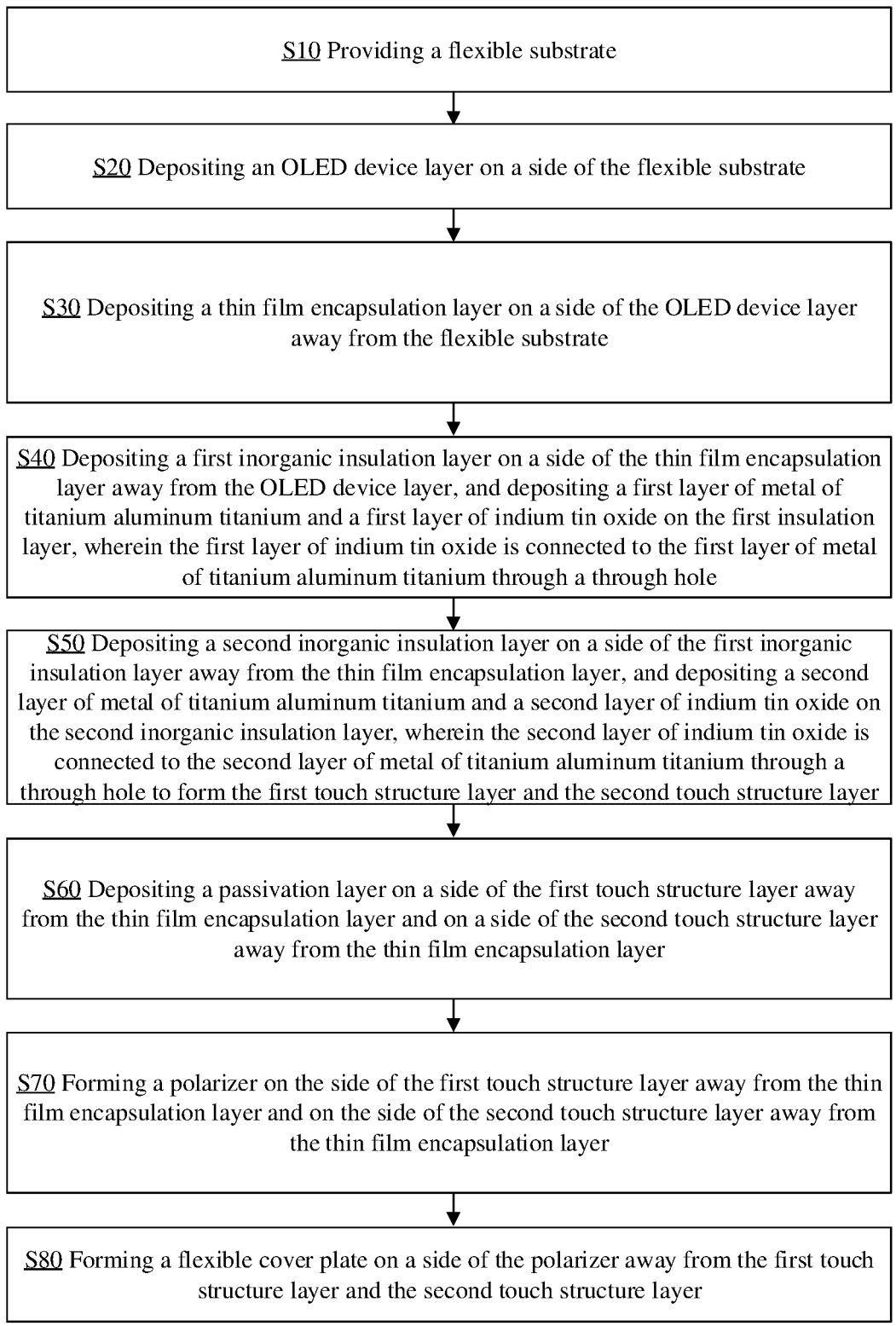
FIG. 6 is a schematic flowchart of an OLED folding display panel manufacturing method provided by an embodiment of the present invention.

With reference to FIG. 6, the present invention also provides an OLED folding display panel manufacturing method, the method comprises steps as follows. A step S10 provides a flexible substrate 21. A step S20 deposits an organic light emitting diode device layer 22 on a side of the flexible substrate 21. A step S30 deposits a thin film encapsulation layer 23 on a side of the organic light emitting diode device layer 22 away from the flexible substrate 21. A step S40 deposits a first inorganic insulation layer 25 on a side of the thin film encapsulation layer 23 away from the organic light emitting diode device layer 22, and deposits a first layer of metal of titanium aluminum titanium 151 and a first layer of indium tin oxide 251 on the first inorganic insulation layer 25. The first layer of indium tin oxide 251 is connected to the first layer of metal of titanium aluminum titanium 151 through a through hole 252. A step S50 deposits a second inorganic insulation layer 26 on a side of the first inorganic insulation layer 25 away from the thin film encapsulation layer 23, and deposits a second layer of metal of titanium aluminum titanium 161 and a second layer of indium tin oxide 261 on the second inorganic insulation layer 26. The second layer of indium tin oxide 261 is connected to the second layer of metal of titanium aluminum titanium 161 through a through hole 262 to form the first touch structure layer (15 and 16) and the second touch structure layer (25 and 26). A step S60 deposits a passivation layer 27 on a side of the first touch structure layer (15 and 16) away from the thin film encapsulation layer 23 and on a side of the second touch structure layer (25 and 26) away from the thin film encapsulation layer 23. A step S70 forms a polarizer 28 on the side of the first touch structure layer (15 and 16) away from the thin film encapsulation layer 23 and on a side of the second touch structure layer (25 and 26) away from the thin film encapsulation layer 23. A step S80 forms a flexible cover plate 29 on a side of the polarizer 28 away from the first touch structure layer (15 and 16) and the second touch structure layer (25 and 26).

In an embodiment of the present invention, before the step S40, depositing a first optical transparent adhesive 241 on a side of the thin film encapsulation layer 23 away from the organic light emitting diode device layer 22. Before the step S60, depositing a second optical transparent adhesive 242 on a side of the first touch structure layer (15 and 16) or the second touch structure layer (25 and 26) away from the polarizer 28.

In an embodiment of the present invention, the first inorganic insulation layer 25 or the second inorganic insulation layer 26 is silicon nitride or silicon oxynitride. The passivation layer 27 is inorganic material or organic material of silicon nitride or silicon oxide. Material and a thickness of the first inorganic insulation layer 25 are the same as material and a thickness of the second inorganic insulation layer 26, and both the first inorganic insulation layer 25 and the second inorganic insulation layer 26 are made by an inkjet-printing process. The first inorganic insulation layer 25 or the second inorganic insulation layer 26 has a certain predetermined thickness, and the predetermined thickness of the first inorganic insulation layer 25 or the second inorganic insulation layer 26 is 3 um.

An OLED folding display panel and a manufacturing method thereof provided by embodiments of the present invention are introduced in details as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. An organic light emitting diode (OLED) folding display panel, comprising: a folding region and a non-folding region; wherein
the folding region and the non-folding region comprise a flexible substrate, an OLED device layer, a thin film encapsulation layer, a first touch structure layer, a second touch structure layer, a polarizer, and a flexible cover plate, wherein the first touch structure layer is located in the folding region, and the second touch structure layer is located in the non-folding region; and
the first touch structure layer and the second touch structure layer are disposed in a same layer, and material and a structure of the first touch structure layer is distinguished from material and a structure of the second touch structure layer, the first touch structure layer is a folding region touch structure layer employing a metal mesh, and the second touch structure layer is a non-folding region touch structure layer employing indium tin oxide.

2. The OLED folding display panel as claimed in claim 1, wherein the flexible substrate is disposed as a lowest layer of the OLED folding display panel;
the OLED device layer is disposed on a side of the flexible substrate;
the thin film encapsulation layer is disposed on a side of the OLED device layer away from the flexible substrate;
the first touch structure layer and the second touch structure layer are disposed on a side of the thin film encapsulation layer away from the flexible substrate;
the polarizer is disposed on a side of the first touch structure layer away from the thin film encapsulation layer and a side of the second touch structure layer away from the thin film encapsulation layer; and
the flexible cover plate is disposed on a side of the polarizer away from the first touch structure layer and the second touch structure layer, and is disposed as an uppermost layer of the OLED folding display panel.

3. The OLED folding display panel as claimed in claim 2, wherein the first touch structure layer and the second touch structure layer have a predetermined thickness.

4. The OLED folding display panel as claimed in claim 3, wherein the predetermined thickness of the first touch structure layer and the second touch structure layer is 50 nm.

5. The OLED folding display panel as claimed in claim 1, wherein the metal mesh employs a sawtooth structure.

6. The OLED folding display panel as claimed in claim 1, wherein the metal mesh employs alloy of titanium aluminum.

7. The OLED folding display panel as claimed in claim 1, wherein a first optical transparent adhesive is disposed between the thin film encapsulation layer and the first touch structure layer or is disposed between the thin film encapsulation layer and the second touch structure layer, and a second optical transparent adhesive is disposed between the first touch structure layer and the polarizer or is disposed between the second touch structure layer and the polarizer.

8. The OLED folding display panel as claimed in claim 7, wherein the first optical transparent adhesive and the second optical transparent adhesive have a predetermined thickness.

9. The OLED folding display panel as claimed in claim 8, wherein the predetermined thickness of the first optical transparent adhesive and the second optical transparent adhesive is 1 micron.

10. An organic light emitting diode (OLED) folding display panel, comprising: a folding region and a non-folding region; wherein
the folding region and the non-folding region comprise a flexible substrate, an OLED device layer, a thin film encapsulation layer, a first touch structure layer, a second touch structure layer, a polarizer, and a flexible cover plate, wherein the first touch structure layer is located in the folding region, and the second touch structure layer is located in the non-folding region;
the first touch structure layer and the second touch structure layer are disposed in a same layer, and material and a structure of the first touch structure layer is distinguished from material and a structure of the second touch structure layer.

11. The OLED folding display panel as claimed in claim 10, wherein the first touch structure layer and the second touch structure layer have a predetermined thickness.

12. The OLED folding display panel as claimed in claim 11, wherein the predetermined thickness of the first touch structure layer and the second touch structure layer is 50 nm.

13. The OLED folding display panel as claimed in claim 11, wherein the first touch structure layer is a folding region touch structure layer employing a metal mesh, and the metal mesh employs a sawtooth structure.

14. An organic light emitting diode (OLED) folding display panel manufacturing method, wherein the method comprises:
a step S10, providing a flexible substrate;
a step S20, depositing an OLED device layer on a side of the flexible substrate;
a step S30, depositing a thin film encapsulation layer on a side of the OLED device layer away from the flexible substrate;
a step S40, depositing a first inorganic insulation layer on a side of the thin film encapsulation layer away from the OLED device layer, and depositing a first layer of alloy of titanium aluminum and a first layer of indium tin oxide on the first inorganic insulation layer, wherein the first layer of indium tin oxide is connected to the first layer of alloy of titanium aluminum through a through hole;

a step S50, depositing a second inorganic insulation layer on a side of the first inorganic insulation layer away from the thin film encapsulation layer, and depositing a second layer of alloy of titanium aluminum and a second layer of indium tin oxide on the second inorganic insulation layer, wherein the second layer of indium tin oxide is connected to the second layer of alloy of titanium aluminum through a through hole to form a first touch structure layer and a second touch structure layer;

a step S60, depositing a passivation layer on a side of the first touch structure layer away from the thin film encapsulation layer and on a side of the second touch structure layer away from the thin film encapsulation layer;

a step S70, forming a polarizer on the side of the first touch structure layer away from the thin film encapsulation layer and on the side of the second touch structure layer away from the thin film encapsulation layer; and a step S80, forming a flexible cover plate on a side of the polarizer away from the first touch structure layer and the second touch structure layer.

15. The OLED folding display panel manufacturing method as claimed in claim 14, wherein before the step S40, depositing a first optical transparent adhesive on a side of the thin film encapsulation layer away from the OLED device layer is performed; before the step S60, depositing a second optical transparent adhesive on a side of the first touch structure layer or the second touch structure layer away from the polarizer is performed.

16. The OLED folding display panel manufacturing method as claimed in claim 14, wherein the first inorganic insulation layer or the second inorganic insulation layer is silicon nitride or silicon oxynitride, and the passivation layer is silicon nitride, silicon oxide, or organic material.

17. The OLED folding display panel manufacturing method as claimed in claim 14, wherein material and a thickness of the first inorganic insulation layer are the same as material and a thickness of the second inorganic insulation layer.

18. The OLED folding display panel manufacturing method as claimed in claim 14, wherein the first inorganic insulation layer or the second inorganic insulation layer comprises a predetermined thickness.

19. The OLED folding display panel manufacturing method as claimed in claim 18, wherein the predetermined thickness of the first inorganic insulation layer or the second inorganic insulation layer is 3 microns.

20. The OLED folding display panel manufacturing method as claimed in claim 14, wherein the first inorganic insulation layer and the second inorganic insulation layer are manufactured by an inkjet-printing process.

* * * * *